United States Patent
Liang

(10) Patent No.: US 6,476,484 B1
(45) Date of Patent: Nov. 5, 2002

(54) HEAT SINK DISSIPATOR FOR ADAPTING TO THICKNESS CHANGE OF A COMBINATION OF A CPU AND A CPU CARRIER

(75) Inventor: Robert Liang, Taoyuan Hsien (TW)

(73) Assignee: Malico Inc., Taoyuan Hsien (TW)

( * ) Notice: Subject to any disclaimer, the term of this patent is extended or adjusted under 35 U.S.C. 154(b) by 0 days.

(21) Appl. No.: 09/924,663

(22) Filed: Aug. 8, 2001

(51) Int. Cl.[7] .............................................. H01L 23/34
(52) U.S. Cl. ........................ 257/718; 257/712; 257/713; 257/706; 257/718; 257/719; 257/722; 257/723; 257/724; 257/725; 257/726; 257/727; 361/703; 361/704; 439/71; 439/72; 439/73; 439/487
(58) Field of Search ................................ 251/722, 706, 251/707, 718, 719, 723–727

(56) References Cited

U.S. PATENT DOCUMENTS

| | | | | |
|---|---|---|---|---|
| 5,421,402 A | * | 6/1995 | Lin ............................ 165/80.3 |
| 5,660,562 A | * | 8/1997 | Lin ............................ 439/487 |
| 6,015,301 A | * | 1/2000 | Brodsky et al. .............. 439/73 |
| 6,086,387 A | * | 7/2000 | Gallagher et al. ............ 439/71 |
| 6,201,697 B1 | * | 3/2001 | McCullough ............... 361/704 |
| 6,243,266 B1 | * | 6/2001 | Lo ............................. 361/704 |

* cited by examiner

Primary Examiner—Nathan J. Flynn
Assistant Examiner—Fazli Erdem

(57) ABSTRACT

A heat sink dissipater includes a retaining device and a heat dissipater. A plurality of fins and a plurality of pads or recesses are integrally formed on the top surface of the heat dissipater. A plurality of resilient legs extend inward from the sides of the retaining device. Retaining edges are also formed on two sides of the retaining device. The resilient legs fall into the gaps between the fins when the retaining device is positioned on the heat dissipater to secure a CPU assembly. In an orientation, the legs are placed on the pads or recesses of the heat dissipater and in an orthogonal orientation, the legs are placed directly on the top surface of the heat dissipater. Therefore, CPU assemblies of different thickness can be accommodated by rotating the retaining device or the heat dissipater 90 degrees.

2 Claims, 4 Drawing Sheets

HEAT SINK DISSIPATOR FOR ADAPTING TO THICKNESS CHANGE OF A COMBINATION OF A CPU AND A CPU CARRIER

FIELD OF THE INVENTION

The present invention relates to a heat sink dissipater, and more particularly to a beat sink dissipater for use with a combination of a CPU and a CPU carrier of different thickness so that a new mold for a heat dissipater for adapting to a combination of a CPU and a PC board with specific thickness is not necessary.

BACKGROUND OF THE INVENTION

With reference to FIG. 1, a CPU assembly normally has a CPU 10 mounted on a PC board 11 and a main board 12 securely engaged with the PC board 11. That is, a combination of the CPU 10, the PC board 11 and the main board 12 has thickness A. When a conventional heat dissipater is to be mounted on the CPU 10 for dissipating beat generated by the operation of the CPU 10, a retaining device 20 is necessary.

The retaining device 20 has two retaining edges 21 respectively formed on opposite sides of the retaining device 20. Bach retaining edge is formed with a barb 211. Multiple resilient legs 22 respectively extend inward from sides of the retaining device 20 adjacent to the sides of the retaining edges 21, and each resilient leg has a bent 221.

When the retaining device 20 is employed to fix the conventional heat dissipater with multiple columns and rows of fins onto the CPU 10, the resilient legs 22 extend into gaps between fins and the bents 221 engage the top face of the CPU 10 to abut the CPU 10 to the PC board 11. Then the retaining edges 21 secure the PC board 11 by means of the barbs 211. However, when another combination having only the CPU 10 and the main board 12 and thus having less thickness compared to the thickness of the previously described combination is used and the same conventional heat dissipater has to be used to dissipate the heat from the CPU 10, a new retaining device is to be developed to adapt to the variation in thickness. Changing the thickness of the combination of the CPU assembly often means a new retaining device or a new heat dissipater, which is quite a waste in cost.

To overcome the shortcomings, the present invention intends to provide an improved heat dissipater to mitigate or obviate the aforementioned problems.

SUMMARY OF THE INVENTION

The primary objective of the invention is to provide a heat sink dissipater having multiple pads integrally formed on the heat sink dissipater so that when the thickness of the combination of the CPU and the CPU carrier is reduced, the bents of the resilient legs can still engage the pads to securely fix the heat sink dissipater onto the CPU.

Another objective of the invention is to provide a heat sink dissipater having multiple recesses integrally formed on the heat sink dissipater so that when the thickness of the combination of the CPU and the CPU carrier is increased, the bents of the resilient legs can still engage bottom faces defining the recesses to securely fix the heat dissipater onto the CPU.

Other objects, advantages and novel features of the invention will become more apparent from the following detailed description when taken in conjunction with the accompanying drawings.

DETAILED DESCRIPTION OF THE INVENTION

Figure 1:
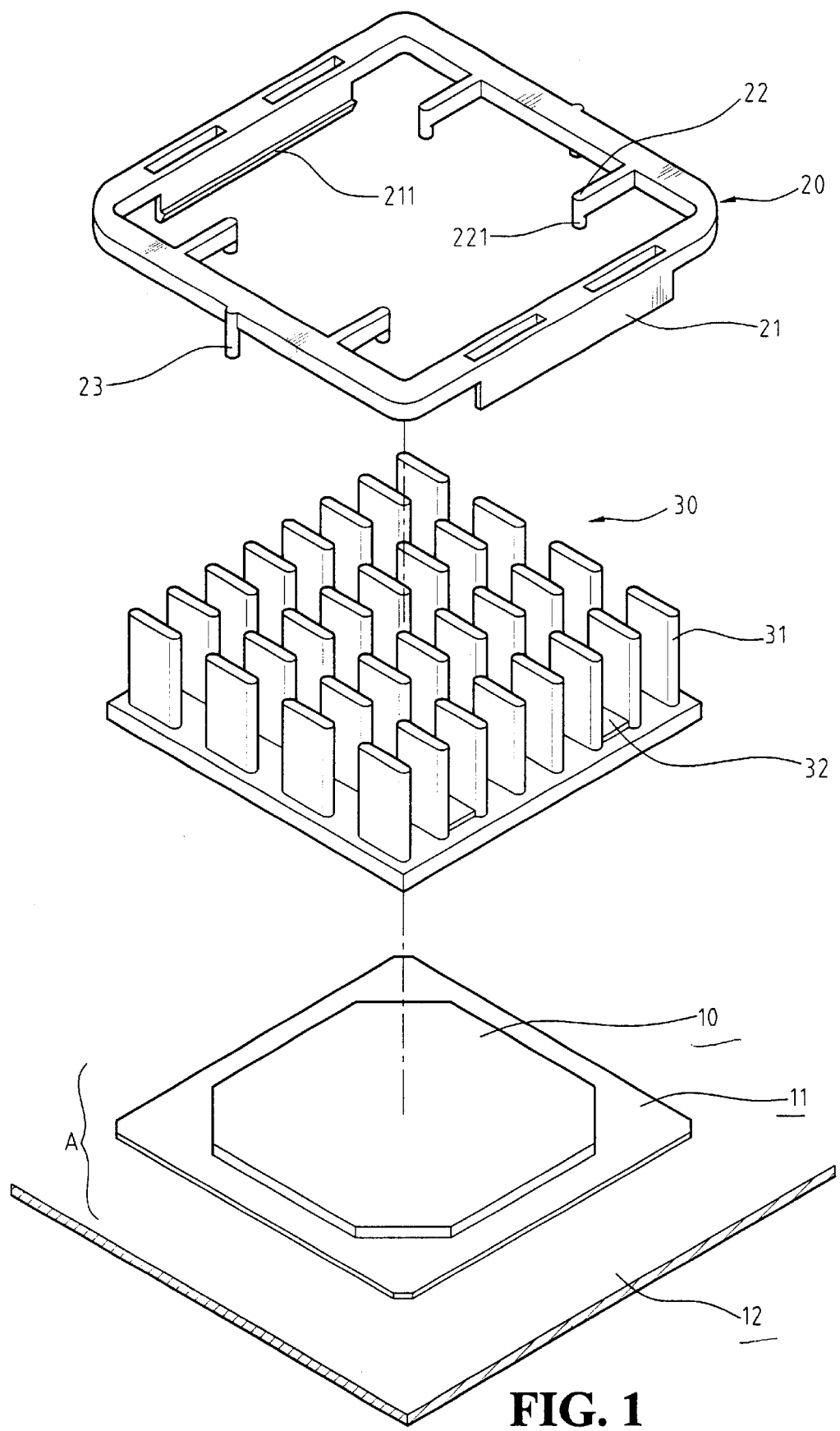
FIG. 1 is an exploded perspective view of the heat sink dissipater of the present invention and the retaining device and the CPU assembly of the first type.

Because the retaining device 20 and the CPU assembly including the first type and the second type are still the same, the same reference numerals are designated to the same elements and are still used to describe the applicability of the heat sink dissipater in accordance with the present invention. Furthermore, the retaining device 20 has two positioning columns 23 each formed on opposite side faces of the retaining device 20.

Figure 2:
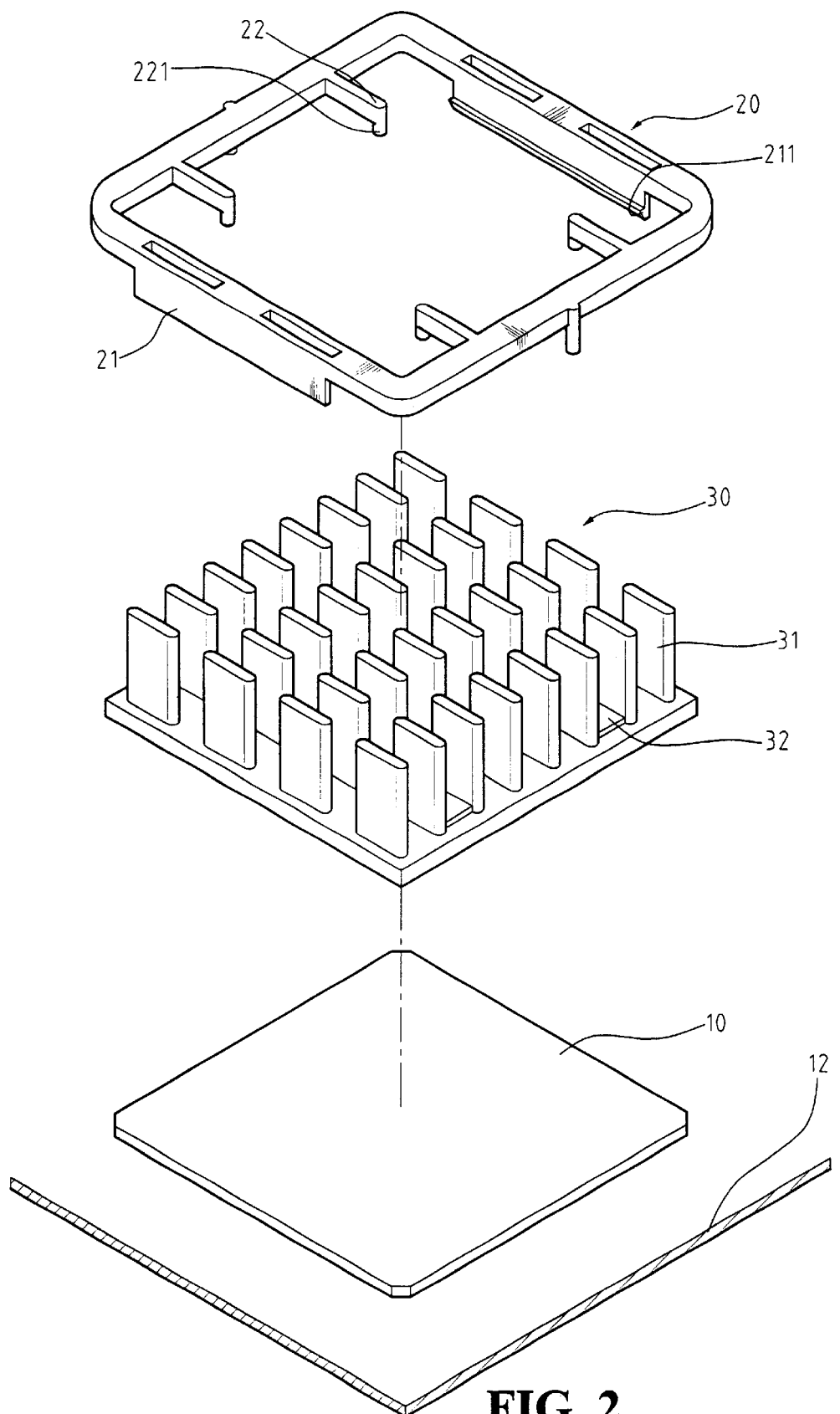
FIG. 2 is an exploded perspective view of FIG. 1 in a different orientation and the retaining device and the CPU assembly of the second type.
Figure 3A:
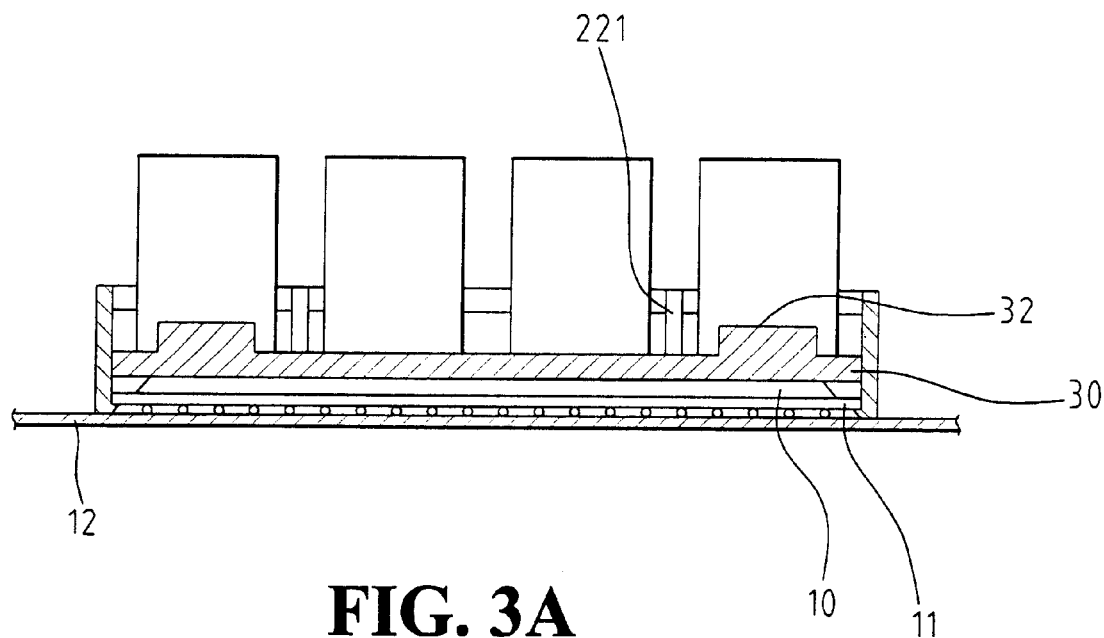
FIG. 3A is a cross sectional view of the assembled retaining device, the heat sink dissipater and the CPU assembly of the first type.
Figure 3B:
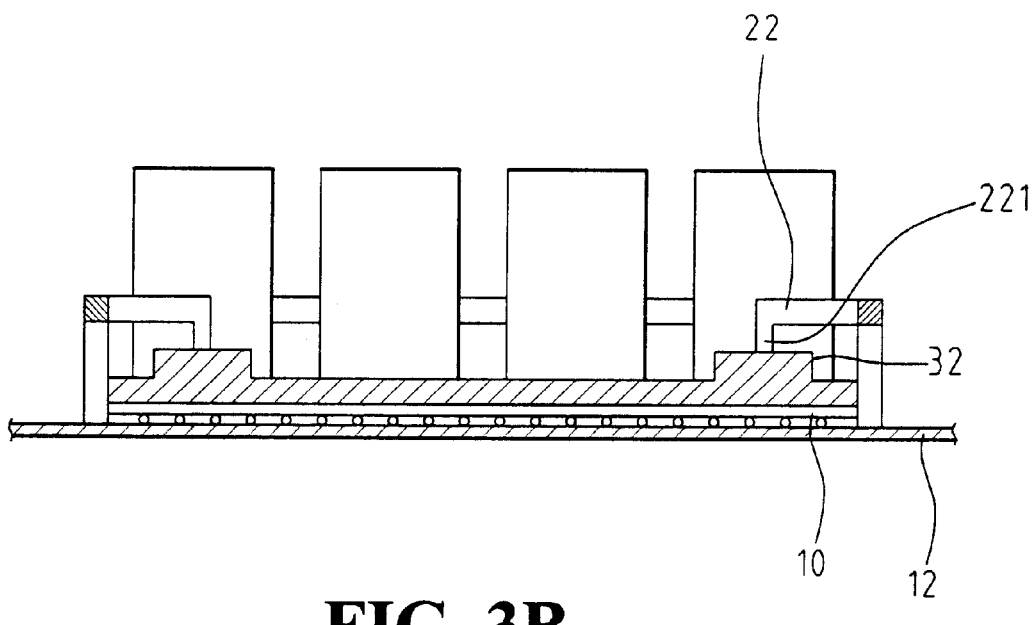
FIG. 3B is a cross sectional view of the assembled retaining device, the heat sink dissipater and the CPU assembly of the second type.

With reference to FIGS. 1, 2, 3A and 3B, the heat sink dissipater 30 has multiple columns and rows of fins 31 and two pairs of pads 32 integrally formed on opposite sides of a top face of the heat sink dissipater 30. According to the configuration of the beat sink dissipater 30, when the CPU assembly includes the CPU 10, the PC board 11 and the main board 12, the bents 221 of the resilient legs 22 extend to gaps between fins 31 to securely engage the heat sink dissipater 30 to the CPU 10. When the CPU assembly includes only the CPU 10 and the main board 12, that is, the thickness of the CPU assembly in FIG. 2 is less than the thickness of the CPU assembly in FIG. 1, the user is able to rotate the heat sink dissipater 30 or the retaining device 20 (as shown in FIG. 2) by 90 degree to allow the resilient legs 22 to extend to gaps between fins 31 to engage the pads 32. Thus, even though the thickness of the CPU assembly is variant, the heat sink dissipater 30 can still be used to different types of CPU assembly with different thickness. Still, the positioning columns 23 are able to abut side faces of the heat sink dissipater 30 and the CPU 10 to avoid the movement of the CPU 10 and the heat sink dissipater 30 when the installation of the heat sink dissipater 30 and the CPU 10 is finished.

Figure 4A:
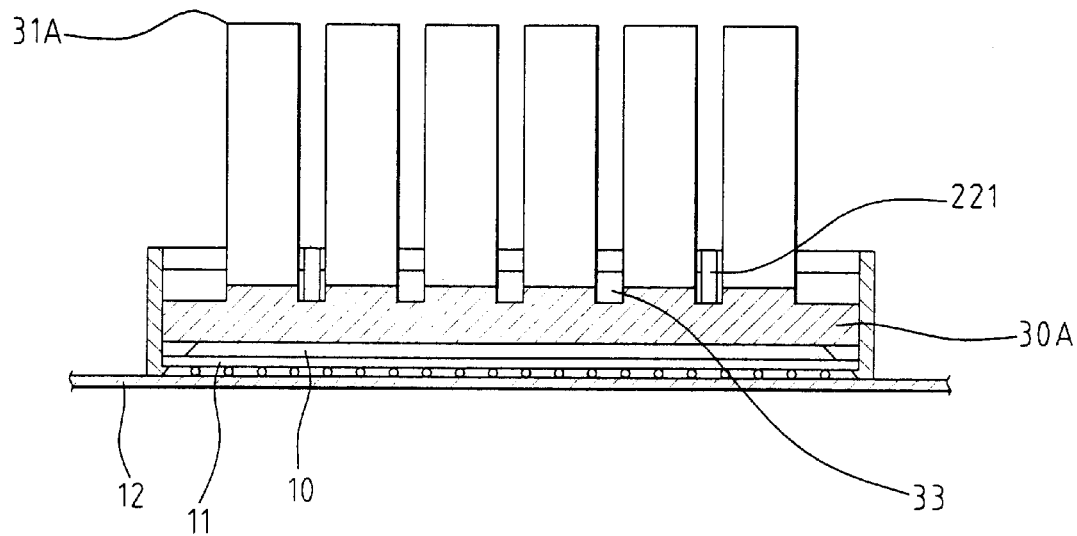
FIGS. 4A and 4B arm cross sectional views of still another preferred embodiment of the invention, wherein the beat sink dissipater has recesses defined in a top face of the heat sink dissipater.
Figure 4B:
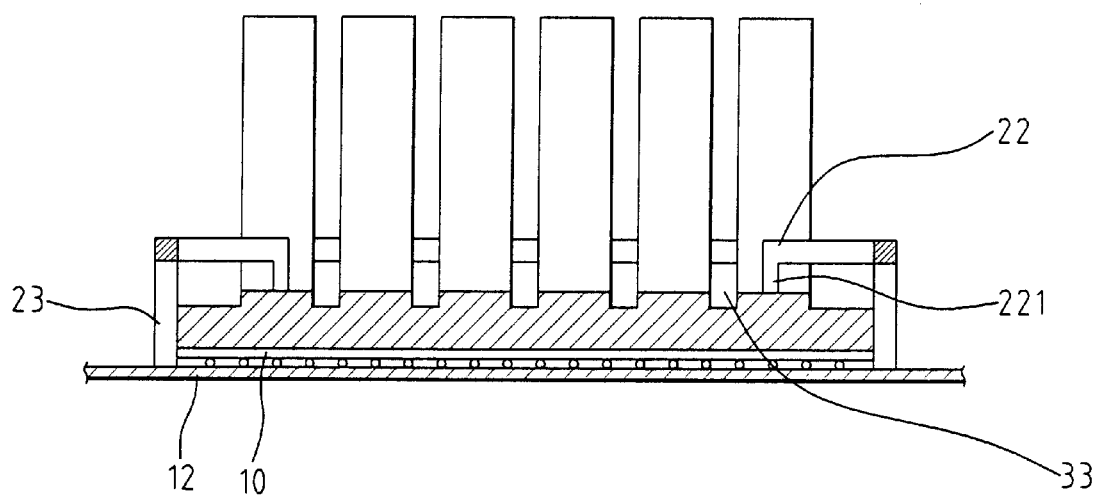

With reference to FIGS. 4A and 4B, another preferred embodiment of the invention is shown. The heat sink dissipater 30A has multiple columns and rows of fins 31A and pairs of recesses 33 each defined in opposite sides of a top face of the heat sink dissipater 30A. According to the configuration of the heat sink dissipater 30A, when the CPU assembly includes the CPU 10, the PC board 11 and the main board 12, due to the increase in thickness, the bents 221 of the resilient legs 22 extend to gaps between fins 31A to securely engage bottom faces defining the recesses 33. When the CPU assembly includes only the CPU 10 and the main board 12, that is, the thickness of the CPU assembly in FIG. 4B is less that the thickness of the CPU assembly in FIG. 4A, the user is able to rotate the heat sink dissipater 30A or the retaining device 20 to allow the resilient legs 22 to extend to gaps between fins 31A to engage the top face of the beat sink dissipater 30A. Thus, even though the thickness of the CPU assembly is variant, the heat sink dissipater 30A can still be used to different type of CPU assembly with different thickness.

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink dissipater, comprising:

a retaining device having a pair of positioning columns formed on first two opposite sides, a pair of retaining edges formed on second two opposite sides, and a plurality of resilient legs extending inwards from said first or second two opposite sides, said retaining edges each being formed with a barb and said resilient legs each having a bent;

a heat dissipater having a plurality of fins formed on a top surface and a plurality of a gaps between said fins, said resilient legs failing into said gaps when said retaining device is positioned on said heat dissipater in a first orientation or a second orientation orthogonal to said first orientation; and plurality of pads formed between fins on said top surface of said heat dissipater;

wherein the bent of each resilient leg is placed on a pad when said retaining device is positioned on said heat dissipater in said first orientation, and each resilient leg is placed directly on said top surface when said retaining device is positioned on said heat dissipater in said second orientation.

2. A heat sink dissipater, comprising:

a retaining device having a pair of positioning columns formed on first two opposite sides, a pair of retaining edges formed on second two opposite sides, and a plurality of resilient legs extending inwards from said first or second two opposite sides, said retaining edges each being formed with a barb and said resilient legs each having a bent;

a heat dissipater having a plurality of fins formed on a top surface and a plurality of gaps between said fins, said resilient legs railing into said gaps when said retaining device is positioned on said heat dissipater in a first orientation or a second orientation orthogonal to said first orientation; and a plurality of recesses formed on said top surface of said heat dissipater;

wherein the bent of each resilient leg is placed on a recess when said retaining device is positioned on said heat dissipater in said first orientation, and each resilient leg is placed directly on said top surface when said retaining device is positioned on said heat dissipater in said second orientation.

* * * * *